United States Patent [19]

Chin et al.

[11] Patent Number: 5,320,976

[45] Date of Patent: Jun. 14, 1994

[54] METHOD FOR MANUFACTURING VLSI SEMICONDUCTOR DEVICE

[75] Inventors: Dae-je Chin, Seoul; Young-woo Park, Suwon, both of Rep. of Korea

[73] Assignee: Samsung Electronics Co., Ltd., Kyunggi-do, Rep. of Korea

[21] Appl. No.: 956,572

[22] Filed: Oct. 5, 1992

Related U.S. Application Data

[63] Continuation of Ser. No. 742,045, Aug. 8, 1991, abandoned.

[30] Foreign Application Priority Data

Apr. 24, 1991 [KR] Rep. of Korea ............ 91-6583

[51] Int. Cl.[5] .................. H01L 21/70; H01L 27/00
[52] U.S. Cl. .............................. 437/48; 437/52; 437/919
[58] Field of Search ............ 437/48, 52, 919, 34; 357/23.6, 23.5; 365/147, 185

[56] References Cited

U.S. PATENT DOCUMENTS

| | | | |
|---|---|---|---|
| 4,356,042 | 10/1982 | Gedaly et al. | 437/43 |
| 4,536,947 | 8/1985 | Bohr et al. | 437/60 |
| 4,882,289 | 11/1989 | Moriuchi et al. | 437/52 |
| 4,962,052 | 10/1990 | Asayama et al. | 437/48 |
| 5,026,657 | 6/1991 | Lee et al. | 437/34 |
| 5,030,585 | 7/1991 | Gonzalez et al. | 437/34 |
| 5,079,613 | 1/1992 | Sawada et al. | 357/23.6 |

FOREIGN PATENT DOCUMENTS

| | | | |
|---|---|---|---|
| 0026129 | 2/1977 | Japan | 357/23.5 |
| 0113278 | 7/1982 | Japan | 437/52 |
| 3-16153 | 1/1991 | Japan | 437/51 |
| 2233154 | 1/1991 | United Kingdom | 437/52 |

OTHER PUBLICATIONS

Wolf et al. "Silicon Processing for the VLSI Era", vol. 1, Lattice Press, 1986, pp. 182-185.

*Primary Examiner*—Robert Kunemund
*Assistant Examiner*—H. Jey Tsai
*Attorney, Agent, or Firm*—Rothwell, Figg, Ernst & Kurz

[57] ABSTRACT

A method for manufacturing a VLSI semiconductor memory device, in which a cell transistor is formed in the cell array section of a semiconductor substrate, successively, a cell capacitor. Then, a transistor is formed in the periphery circuit section of the substrate. Therefore, access transistors of the cell array section are formed independently from transistors of the peripheral circuit section, optimizing transistor performance.

3 Claims, 3 Drawing Sheets

METHOD FOR MANUFACTURING VLSI SEMICONDUCTOR DEVICE

This is a continuation of application Ser. No. 07/742,045, filed Aug. 8, 1991 now abandoned.

BACKGROUND OF THE INVENTION

The present invention relates to a method for manufacturing a VLSI semiconductor device, and particularly to a method for manufacturing a VLSI semiconductor device with the density of 16M DRAMs or greater.

Along with higher packing density and miniaturization which requires processing techniques on a 0.5 μm design rule, 16M DRAM devices demand reliability and performance improvements. In consideration of reliability, a supply voltage of 3.3 V is used instead of using 5 V, providing decreased gate oxide film failure rate and improved time-dependent dielectric breakdown characteristics. And, for improving performance, it is necessary to boost the word line voltage for driving the access transistors of the cell array. For high speed operation, a technique is needed which allows a gate insulating layer of a periphery circuit's transistor to be thinner than before.

The desired case is to optimize characteristics and performance between transistors in the cell array and transistors in the peripheral circuitry. Generally, in a conventional DRAM process, a cell transistor of the cell array and a peripheral transistor of the peripheral circuit section are formed at the same time, with the cell capacitor being formed later. Accordingly, the close interdependence between the cell transistor and the peripheral transistor in the manufacturing process is followed by many restrictions in the improvements to the characteristics of each.

Moreover, since the cell transistor and the peripheral transistor are simultaneously formed on the wafer and, then, the capacitor is formed in the cell array, an impurity implanted into the silicon is diffused by the heat treatment performed during the formation of the capacitor. Thus, shallow junctions in the peripheral transistor are difficult, and the succeeding heat treatment degrades transistor's performance and reliability. Especially susceptible to the heat treatment are dopants such as boron (B) or boron difluoride ($BF_2$) which are used to adjust the threshold voltage of a PMOS transistor, forming a deep junction and lowering the breakdown voltage of the PMOS transistor.

SUMMARY OF THE INVENTION

To solve the aforesaid problems which are inherent to conventional techniques, it is an object of the present invention to provide a VLSI semiconductor memory device in which transistors in the peripheral circuitry are formed independently to transistors in the cell array, enabling transistor performance to be optimized.

It is another object of the present invention to provide a method for manufacturing a VLSI semiconductor memory device, in which, after forming a cell capacitor, a transistor in the peripheral circuit section is formed, permitting the succeeding heat treatment applied to the transistor to be minimized, so that reliability and performance of the transistors can be improved.

To achieve these and other objects, the method for manufacturing a VLSI semiconductor memory device according to the present invention comprises the steps of: forming a cell transistor in the cell array section of a semiconductor substrate; successively forming a cell capacitor in the cell array section; and forming a transistor of the peripheral circuit section of the semiconductor substrate.

BRIEF DESCRIPTION OF THE DRAWINGS

Other objects and advantages of the present invention will become more apparent by the following description with reference to accompanying drawings, in which.

DETAILED DESCRIPTION OF THE INVENTION

In order to further the understanding of the present invention, one embodiment according to the present invention will be described with reference to accompanying drawings.

Figure 1A:
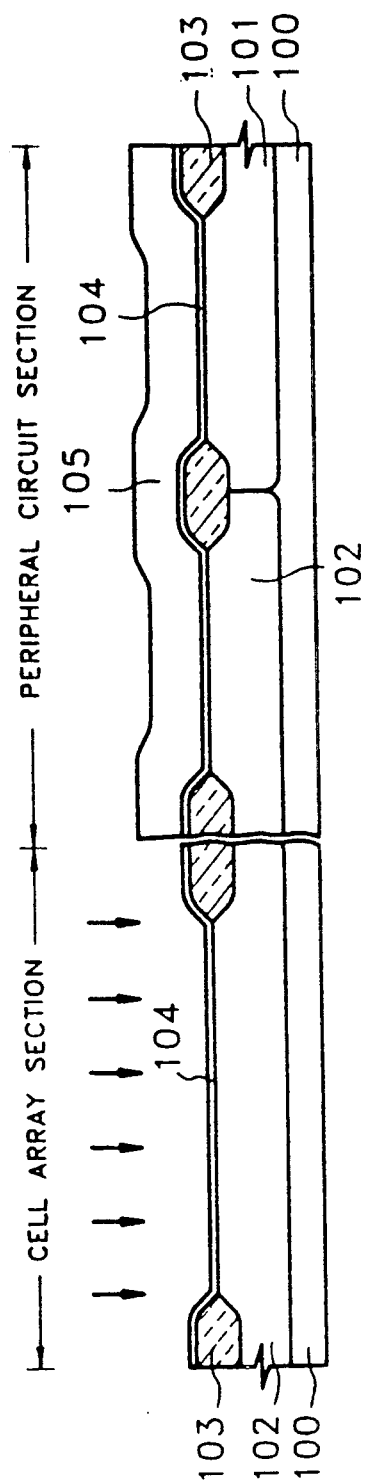
FIGS. 1A through 1J show a process for manufacturing a VLSI semiconductor memory device according to the present invention.

Referring to FIG. 1A, an n-well 101 and a p-well 102 are each formed in a silicon substrate 100. Then, an active region is defined by growing a field oxide layer 103 via a conventional device isolation method such as the local oxidation of silicon (LOCOS) method. Successively, a first oxide layer 104 is formed on the whole structure's surface. The peripheral circuit section is covered with a photoresist 105. The cell array section is ion-implanted with a p-type impurity to adjust the threshold voltage of the cell transistors.

Figure 1B:
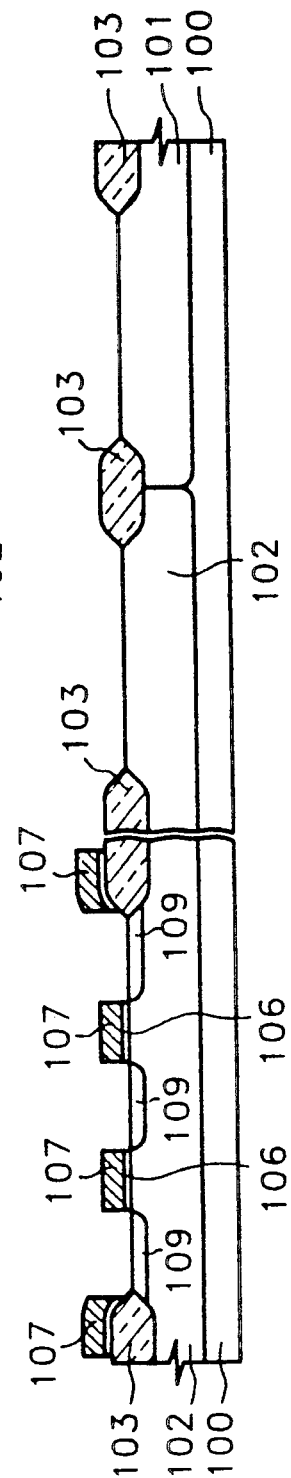

Referring to FIG. 1B, after the photoresist 105 has been removed, and a second oxide layer 106 is formed to a thickness of about 160 Å. Then, a polysilicon of a thickness of about 2500 Å is formed on the second oxide layer 106. Thereafter, the polysilicon layer and the second oxide layer 106 are patterned via a photolithography method, using a word line mask, to form a first conductive layer 107 which serves as a gate electrode of the cell transistor. The second oxide layer 106 which is provided as a gate oxide layer beneath the first conductive layer 107. Then, the peripheral circuit section is covered with a photoresist, and an n− impurity is ion-implanted to the cell array section, forming an n− impurity doped region 109 in the superficies of the silicon substrate. This n− impurity doped region 109 serves as source/drain regions of the cell transistor.

Figure 1C:
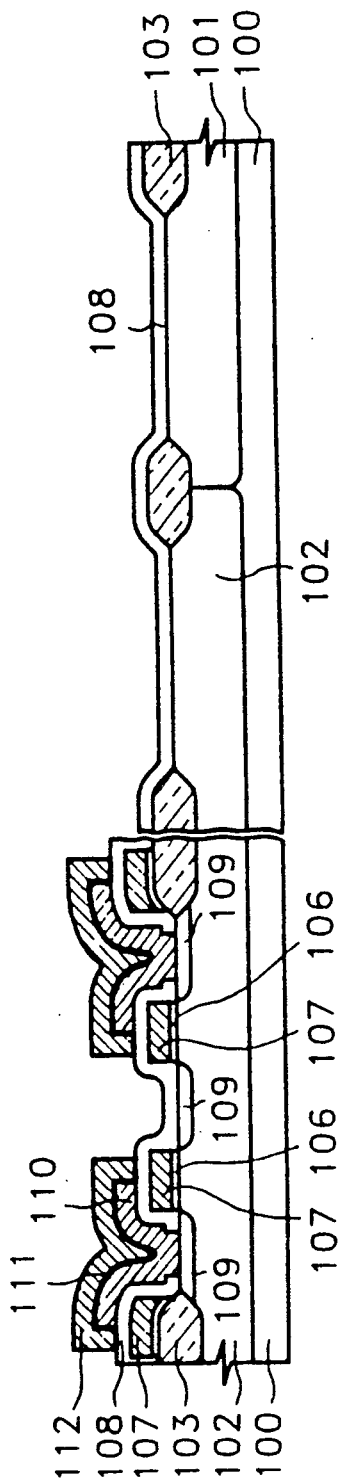

Referring to FIG. 1C, the photoresist has been removed, a high temperature oxide (HTO) layer 108 is formed over the whole surface of the structure. Then, a storage node contact hole is formed in the HTO layer 108. Successively, polysilicon is formed over the whole surface to a thickness of about 2500 Å to 4000 Å, and is patterned via a photolithography method using the storage node mask, thereby forming a second conductive layer 110 which functions as the storage node of a capacitor. Thereafter, a stacked layer, such as an oxide/nitride/oxide layer or a nitride/oxide layer, is formed as a capacitor insulating layer 111, and polysilicon is formed on the capacitor insulating layer 111 to a thickness of about 3000 Å to 4000 Å. The polysilicon layer and the capacitor insulating layer are patterned by a photolithography method using a plate electrode mask, forming a third conductive layer 112 which serves as a plate electrode of the capacitor.

When referring to FIGS. 1D to 1I, only the peripheral circuit section is shown in the drawings.

Figure 1D:
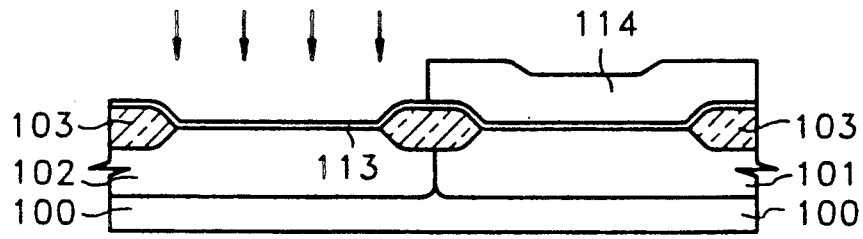

Referring to FIG. 1D, after completing the capacitor in the cell array section, the HTO layer 108 of the periphery circuit section is completely removed. Then, a third oxide layer 113 is formed, followed by the n-well 101 being covered with a photoresist 114, and the p-well 102 ion-implanted with an impurity to adjust the threshold voltage of the NMOS transistors.

Figure 1E:
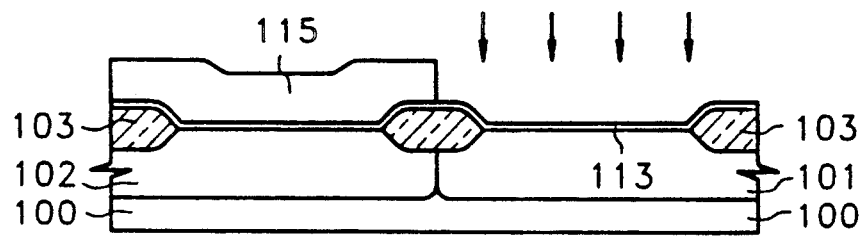

Referring to FIG. 1E, the photoresist 114 which was covering the n-well 101 is removed. Then, the p-well 102 is covered with a photoresist 115, and an impurity is ion-implanted to the n-well 101 to adjust the threshold voltage of the PMOS transistors.

Figure 1F:
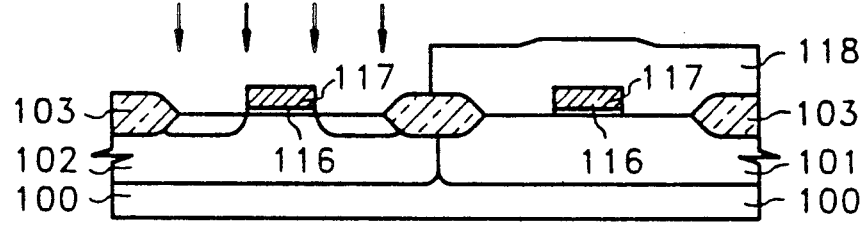

Referring to FIG. 1F, the photoresist 115 has been removed, and a fourth oxide layer 116 is formed on the surface of the peripheral circuit section. The fourth oxide layer 116 is covered with polysilicon, roughly 2000 Å to 4000 Å thick, then both layers are patterned together via a photolithography method using the gate electrode mask of the peripheral circuit section, forming a fourth conductive layer 117 which serves as a gate electrode of the transistor of the peripheral circuit section. The fourth oxide layer 116 is provided as a gate oxide layer beneath the fourth conductive layer 117. The gate oxide layer 116 is made thinner than the gate oxide layer 106 of the cell array section. Successively, the n-well 101 is covered with a photoresist 118, an n⁻ impurity is ion-implanted in the p-well 102, forming lightly doped source/drain regions 119 for the NMOS transistors.

Figure 1G:
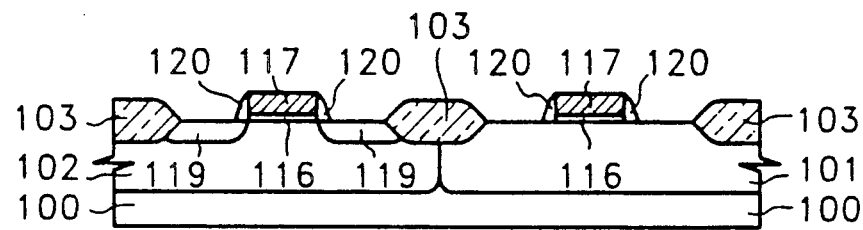

Referring to FIG. 1G, the photoresist 118 has been removed, the peripheral circuit section is covered with an HTO layer. Then, the HTO layer is anisotrpically etched to form sidewall spacers 120 of the HTO layer material on the sidewalls of the fourth conductive layer 117.

Figure 1H:
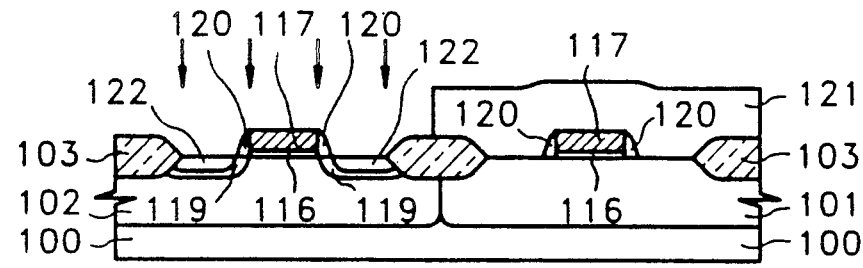

Referring to FIG. 1H, the n-well 101 is covered with a photoresist 121, and the p-well 102 is ion-implanted with an n⁺ impurity, thereby forming source/drain regions 122. Accordingly, an NMOS transistor with a lightly doped drain (LDD) structure is formed.

Figure 1I:
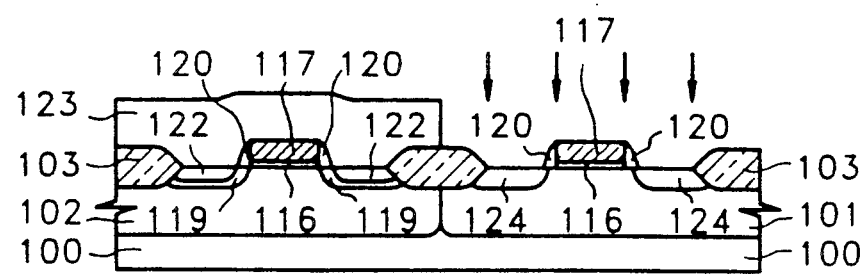

Referring to FIG. 1I, the photoresist 121 on the n-well 101 has been removed, and the p-well 102 is covered with a photoresist 123. Then, a p⁺ impurity is ion-implanted in the n-well 102, thereby forming p⁺ source/drain regions 124. Thus, a PMOS transistor with a single drain structure is formed.

Figure 1J:
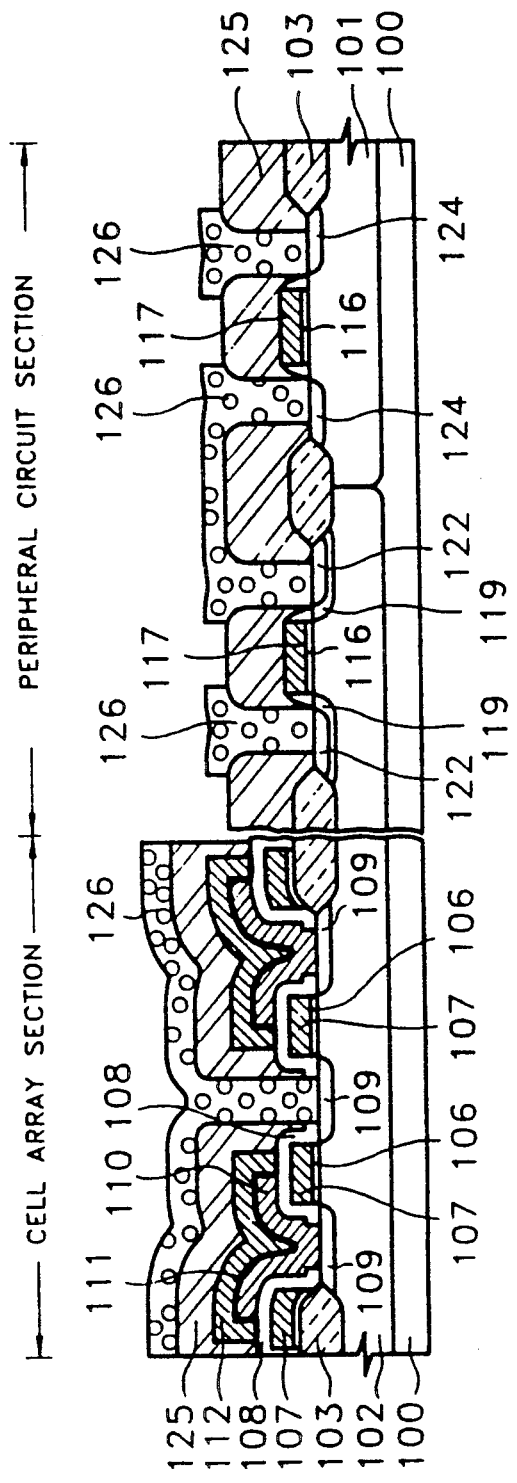

Referring to FIG. 1J, the photoresist 123 has been removed, and the whole surface of the structure is covered with an inter-insulating layer 125. A bit line contact hole and a contact hole for forming source/drain electrodes are formed in the inter-insulating layer 125. Thereafter, a metal layer such as aluminum, an aluminum alloy, or a stacked metal layer, is formed over the whole surface of the structure by a physical atmosphere deposition, and the metal layer is patterned to form a metal wiring 126.

In the above-described present invention, the transistors of the cell array section are formed independently from the transistors of the peripheral circuit section, thereby optimizing each transistor's characteristics. That is, respective transistors in the cell array section and the peripheral circuit section are separately designed in accordance with independent construction conditions: ion-implantation for adjusting the threshold voltage, thickness and size adjustment of the gate oxide layer, and the particular dopant and level of the ion implantation energy. Therefore, after forming the cell transistors, the peripheral transistors are formed, so that the succeeding heat treatment process applied to the peripheral transistors can be minimized, also providing more freedom in temperature condition in forming capacitors. In particular, since boron ion-implantation for adjusting the threshold voltage of a transistor is carried out after capacitor formation, shallow junctions can be maintained, and as a result, improving the breakdown voltage of the PMOS transistors.

What is claimed is:

1. A method for manufacturing a VLSI semiconductor memory device comprising the steps of:

doping an impurity to adjust a threshold voltage only in an active region of a cell array section of a semiconductor substrate;

forming a first conductive layer serving as a gate electrode by interposing a gate oxide layer on said cell array section, and doping an n-type impurity in said active region of said cell array section to form source/drain regions, thereby forming a cell transistor;

covering said cell array section in which said cell transistor is formed with an HTO layer, forming a storage node contact hole in said HTO layer, and sequentially forming a second conductive layer, an insulating layer of a capacitor, and a third conductive layer in said cell array section, thereby forming a cell capacitor; and, after the formation of said cell transistor and said cell capacitor, performing the steps of doping an impurity to adjust the threshold voltage only in an active region of a peripheral circuit section of said semiconductor substrate;

forming an NMOS transistor with a lightly doped drain structure in a p-well of said peripheral circuit section, and forming a PMOS transistor with a single drain structure in an n-well of said peripheral circuit section; and covering an inter-insulating layer on the whole surface of the structure, forming a contact hole in said inter-insulating layer, and forming a metal wiring layer by a conventional method.

2. A method for manufacturing a VLSI semiconductor memory device as claimed in claim 1, wherein said transistor in said peripheral circuit section is formed to have a lightly doped drain structure for NMOS transistors; and is formed to have a single drain structure for PMOS transistors.

3. A method for manufacturing a VLSI semiconductor memory device as claimed in claim 1, wherein the gate oxide layer of said transistor in said peripheral circuit section is thinner than that of said transistor in said cell array section.

* * * * *

UNITED STATES PATENT AND TRADEMARK OFFICE
CERTIFICATE OF CORRECTION

PATENT NO. : 5,320,976
DATED : June 14, 1994
INVENTOR(S) : Dae-je Chin et al

It is certified that error appears in the above-indentified patent and that said Letters Patent is hereby corrected as shown below:

On the title page, item [54] and in col. 1, lines 2 and 3, rewrite the title as --METHOD FOR MANUFACTURING A VLSI SEMICONDUCTOR DEVICE HAVING CELL ARRAY TRANSISTORS AND PERIPHERAL CIRCUIT TRANSISTORS--.

On the title page, item [75] Inventors: the second inventor's town of residence should be changed from "Suwon" to --Kyunggi-do--.

Signed and Sealed this

Twentieth Day of September, 1994

Attest:

BRUCE LEHMAN

Attesting Officer    Commissioner of Patents and Trademarks